(12) United States Patent
Howard et al.

(10) Patent No.: US 10,741,758 B2
(45) Date of Patent: Aug. 11, 2020

(54) WIDTH-WISE SEGMENTED SLOT CONTACTS FOR IMPROVING PERFORMANCE IN PHASE-CHANGE MATERIAL (PCM) RADIO FREQUENCY (RF) SWITCHES

(71) Applicant: Newport Fab, LLC, Newport Beach, CA (US)

(72) Inventors: David J. Howard, Irvine, CA (US); Jefferson E. Rose, Hawthorne, CA (US); Gregory P. Slovin, Irvine, CA (US); Nabil El-Hinnawy, Irvine, CA (US); Michael J. DeBar, Tustin, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/733,502

(22) Filed: Jan. 3, 2020

(65) Prior Publication Data
US 2020/0144497 A1 May 7, 2020

Related U.S. Application Data

(60) Division of application No. 16/216,717, filed on Dec. 11, 2018, which is a continuation-in-part of (Continued)

(51) Int. Cl.
*H01L 45/00* (2006.01)

(52) U.S. Cl.
CPC .......... *H01L 45/1253* (2013.01); *H01L 45/06* (2013.01); *H01L 45/1206* (2013.01); (Continued)

(58) Field of Classification Search
CPC . H01L 45/06; H01L 45/1206; H01L 45/1226; H01L 45/1286; H01L 45/143; H01L 45/144
See application file for complete search history.

(56) References Cited

U.S. PATENT DOCUMENTS

2016/0056373 A1* 2/2016 Goktepeli ............. H01L 45/126
257/2

* cited by examiner

*Primary Examiner* — Hoai V Pham
(74) *Attorney, Agent, or Firm* — Farjami & Farjami LLP

(57) ABSTRACT

A radio frequency (RF) switch includes a phase-change material (PCM) and a heating element underlying an active segment of the PCM, the PCM and heating element being situated over a substrate. A contact dielectric is over the PCM. PCM contacts have upper portions and uniform plate slot lower portions. The uniform plate slot lower portions have a total plate resistance $R_{PLATE}$, and a total plate slot interface resistance $R_{PLATE-INT}$. The upper portions have a total capacitance $C_{UPPER}$ to the uniform plate slot lower portions, and the PCM has a total capacitance $C_{PCM}$ to the substrate. The uniform plate slot lower portions significantly reduce a product of $(R_{PLATE}+R_{PLATE-INT})$ and $(C_{UPPER}+C_{PCM})$. As an alternative to the uniform plate slot lower portions, PCM contacts have segmented lower portions. The segmented lower portions significantly reduce $C_{UPPER}$.

20 Claims, 13 Drawing Sheets

Related U.S. Application Data application No. 16/103,490, filed on Aug. 14, 2018, now Pat. No. 10,476,001, and a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993, and a continuation-in-part of application No. 16/114,106, filed on Aug. 27, 2018, and a continuation-in-part of application No. 16/185,620, filed on Nov. 9, 2018, now Pat. No. 10,615,338.

(52) U.S. Cl.
CPC ...... *H01L 45/1226* (2013.01); *H01L 45/1286* (2013.01); *H01L 45/143* (2013.01); *H01L 45/144* (2013.01)

WIDTH-WISE SEGMENTED SLOT CONTACTS FOR IMPROVING PERFORMANCE IN PHASE-CHANGE MATERIAL (PCM) RADIO FREQUENCY (RF) SWITCHES

CLAIMS OF PRIORITY

This is a divisional of application Ser. No. 16/216,717 filed on Dec. 11, 2018. Application Ser. No. 16/216,717 filed on Dec. 11, 2018 ("the parent application") is a continuation-in-part of and claims the benefit of and priority to application Ser. No. 16/103,490 filed on Aug. 14, 2018, titled "Manufacturing RF Switch Based on Phase-Change Material,". The parent application is also a continuation-in-part of and claims the benefit of and priority to application Ser. No. 16/103,587 filed on Aug. 14, 2018, titled "Design for High Reliability RF Switch Based on Phase-Change Material,". The parent application is also a continuation-in-part of and claims the benefit of and priority to application Ser. No. 16/103,646 filed on Aug. 14, 2018, titled "PCM RF Switch Fabrication with Subtractively Formed Heater,". The parent application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element,". The present parent application is further a continuation-in-part of and claims the benefit of and priority to application Ser. No. 16/185,620 filed on Nov. 9, 2018, titled "Phase-Change Material (PCM) Contacts with Slot Lower Portions and Contact Dielectric for Reducing Parasitic Capacitance and Improving Manufacturability in PCM RF Switches,". The disclosures and contents of all of the above-identified applications are hereby incorporated fully by reference into the parent application and the present divisional application.

BACKGROUND

Phase-change materials (PCM) are capable of transforming from a crystalline phase to an amorphous phase. These two solid phases exhibit differences in electrical properties, and semiconductor devices can advantageously exploit these differences. Given the ever-increasing reliance on radio frequency (RF) communication, there is particular need for RF switching devices to exploit phase-change materials. However, the capability of phase-change materials for phase transformation depends heavily on how they are exposed to thermal energy and how they are allowed to release thermal energy. For example, in order to transform into an amorphous phase, phase-change materials may need to achieve temperatures of approximately seven hundred degrees Celsius (700° C.) or more, and may need to cool down within hundreds of nanoseconds.

Heating elements in PCM RF switches often contribute to parasitics, such as parasitic capacitors, associated with RF frequencies and result in performance tradeoffs. Additionally, the performance of an RF switch using PCM depends heavily on how contacts to the PCM are made. Fabricating contacts to the PCM without significant RF performance tradeoffs becomes complex, especially where the RF switch is designed primarily around thermal performance. Fabrication techniques applicable to conventional semiconductor devices may not be suitable for fabricating PCM RF switches. Accordingly, accommodating PCM in RF switches can present significant manufacturing challenges. Specialty manufacturing is often impractical, and large scale manufacturing generally trades practicality for the ability to control device characteristics and critical dimensions.

Thus, there is a need in the art to reliably manufacture PCM RF switches having improved RF performance.

SUMMARY

The present disclosure is directed to phase-change material (PCM) contact configurations for improving performance in PCM RF switches, substantially as shown in and/or described in connection with at least one of the figures, and as set forth in the claims.

DETAILED DESCRIPTION

Figure 1:
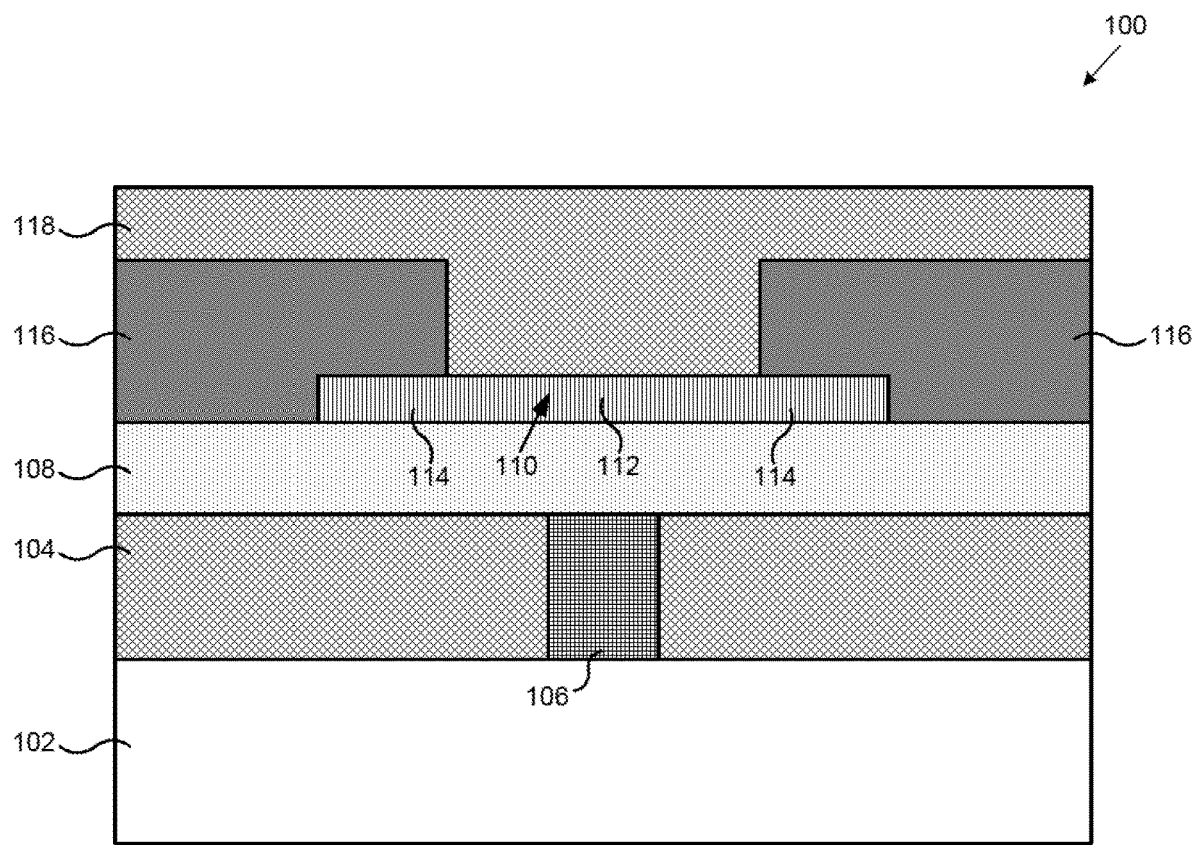
FIG. 1 illustrates a cross-sectional view of a portion of a phase-change material (PCM) radio frequency (RF) switch.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a cross-sectional view of a portion of a phase-change material (PCM) radio frequency (RF) switch. As shown in FIG. 1, PCM RF switch 100 includes substrate 102, lower dielectric 104, heating element 106, thermally conductive and electrically insulating layer 108, PCM 110 having active segment 112 and passive segments 114, PCM contacts 116, and upper dielectric.

Substrate 102 is situated under lower dielectric 104. In one implementation, substrate 102 is an insulator, such as silicon oxide ($SiO_2$). In various implementations, substrate 102 is a silicon (Si), silicon-on-insulator (SOI), sapphire, complementary metal-oxide-semiconductor (CMOS), bipolar CMOS (BiCMOS), or group III-V substrate. In various implementations, a heat spreader is integrated with substrate 102, or substrate 102 itself performs as a heat spreader. Substrate 102 can have additional layers (not shown in FIG. 1). In one implementation, substrate 102 can comprise a plurality of interconnect metal levels and interlayer dielectric layers. Substrate 102 can also comprise a plurality of devices, such as integrated passive devices (IPDs) (not shown in FIG. 1).

Lower dielectric 104 in PCM RF switch 100 is situated on top of substrate 102. As shown in FIG. 1, lower dielectric 104 is also adjacent to sides of heating element 106. Lower dielectric 104 may comprise a material with thermal conductivity lower than that of thermally conductive and electrically insulating layer 108. In various implementations, lower dielectric 104 can comprise silicon oxide ($SiO_2$), silicon nitride (SiN), or another dielectric.

Heating element 106 in PCM RF switch 100 is situated in lower dielectric 104. Heating element 106 also underlies active segment 112 of PCM 110. Heating element 106 generates a crystallizing heat pulse or an amorphizing heat pulse for transforming active segment 112 of PCM 110. Heating element 106 can comprise any material capable of Joule heating. Heating element 106 can be connected to electrodes of a current source (not shown in FIG. 1) that generates a crystallizing current pulse or an amorphizing current pulse. Preferably, heating element 106 comprises a material that exhibits minimal electromigration or substantially no electromigration. In various implementations, heating element 106 can comprise a metal such as tungsten (W), molybdenum (Mo), titanium (Ti), titanium tungsten (TiW), titanium nitride (TiN), tantalum (Ta), nickel chromium (NiCr), or nickel chromium silicon (NiCrSi). For example, in one implementation, heating element 106 comprises tungsten lined with titanium and titanium nitride.

Thermally conductive and electrically insulating layer 108 in PCM RF switch 100 is situated on top of heating element 106 and lower dielectric 104, and under PCM 110 and, in particular, under active segment 112 of PCM 110. Thermally conductive and electrically insulating layer 108 ensures efficient heat transfer from heating element 106 toward active segment 112 of PCM 110, while impeding electrical signals from leaking out from PCM contacts 116 to heating element 106 or to other neighboring structures. Thermally conductive and electrically insulating layer 108 can comprise any material with high thermal conductivity and high electrical resistivity. In various implementations, thermally conductive and electrically insulating layer 108 can comprise aluminum nitride (AlN), aluminum oxide ($Al_xO_y$), beryllium oxide ($Be_xO_y$), silicon carbide (SiC), diamond, or diamond-like carbon.

PCM 110 in PCM RF switch 100 is situated on top of thermally conductive and electrically insulating layer 108. PCM 110 includes active segment 112 and passive segments 114. Active segment 112 of PCM 110 approximately overlies heating element 106 and is approximately defined by heating element 106. Passive segments 114 of PCM 110 extend outward and are transverse to heating element 106, and are situated approximately under PCM contacts 116. As used herein, "active segment" refers to a segment of PCM that transforms between crystalline and amorphous phases, for example, in response to a crystallizing or an amorphizing heat pulse generated by heating element 106, whereas "passive segment" refers to a segment of PCM that does not make such transformation and maintains a crystalline phase (i.e., maintains a conductive state). With proper heat pulses and heat dissipation, active segment 112 of PCM 110 can transform between crystalline and amorphous phases, allowing a PCM RF switch to switch between ON and OFF states respectively.

PCM 110 can comprise germanium telluride ($Ge_xTe_y$), germanium antimony telluride ($Ge_xSb_yTe_z$), germanium selenide ($Ge_xSe_y$), or any other chalcogenide. In various implementations, PCM 110 can be germanium telluride having from forty percent to sixty percent germanium by composition (i.e., $Ge_xTe_y$, where $0.4 \leq X \leq 0.6$ and $Y=1-X$). The material for PCM 110 can be chosen based upon ON state resistivity, OFF state electric field breakdown voltage, crystallization temperature, melting temperature, or other considerations. PCM 110 can be provided, for example, by physical vapor deposition (PVD) sputtering, chemical vapor deposition (CVD), evaporation, or atomic layer deposition (ALD). In one implementation, PCM 110 can have a thickness of approximately five hundred angstroms to approximately two thousand angstroms (500 Å-2000 Å). In other implementations, PCM 110 can have any other thicknesses. The thickness of PCM 110 can be chosen based upon sheet resistance, crystallization power, amorphization power, or other considerations. It is noted that in FIG. 1, current flowing in heating element 106 flows substantially under active segment 112 of PCM 110.

PCM contacts 116 in PCM RF switch 100 are situated on top of passive segments 114 of PCM 110 and thermally conductive and electrically insulating layer 108, and on sidewalls of PCM 110. PCM contacts 116 provide RF signals to and from PCM 110. In various implementations, PCM contacts 116 can comprise tungsten (W), copper (Cu), or aluminum (Al). Upper dielectric 118 is situated over PCM contacts 116 and over PCM 110.

Because PCM contacts 116 in PCM RF switch 100 are situated both on top of PCM 110 and on sidewalls of PCM 110, PCM contacts 116 perform as heat sinks for PCM 110. When PCM contacts 116 sink heat from PCM 110, more heat is required from heating element 106 in order to transform active segment 112 of PCM 110, and thus higher power is required to switch between ON and OFF states.

Further, PCM RF switch 100 does not optimize various figures of merit. The ON state resistance ($R_{ON}$) of a PCM RF switch, the OFF state parasitic capacitance ($C_{OFF}$) of a PCM RF switch, and the product of $R_{ON}$ and $C_{OFF}$ are figures of merit that characterize the performance of a PCM RF switch, where lower values represent improved performance. In PCM RF switch 100, PCM contacts 116 in PCM RF switch 100 have wide bottom surface areas situated on thermally conductive and electrically insulating layer 108. These wide bottom surface areas of PCM contacts 116 form relatively large parasitic capacitors with heating element 106, and with substrate 102 when substrate 102 includes a heat spreader, IPDs, and/or semiconductive material (not shown in FIG. 1A), and increase the total parasitic capacitance of PCM RF switch 100. Thus, PCM RF switch 100 has increased $C_{OFF}$ and does not optimize figures of merit.

Figure 2:
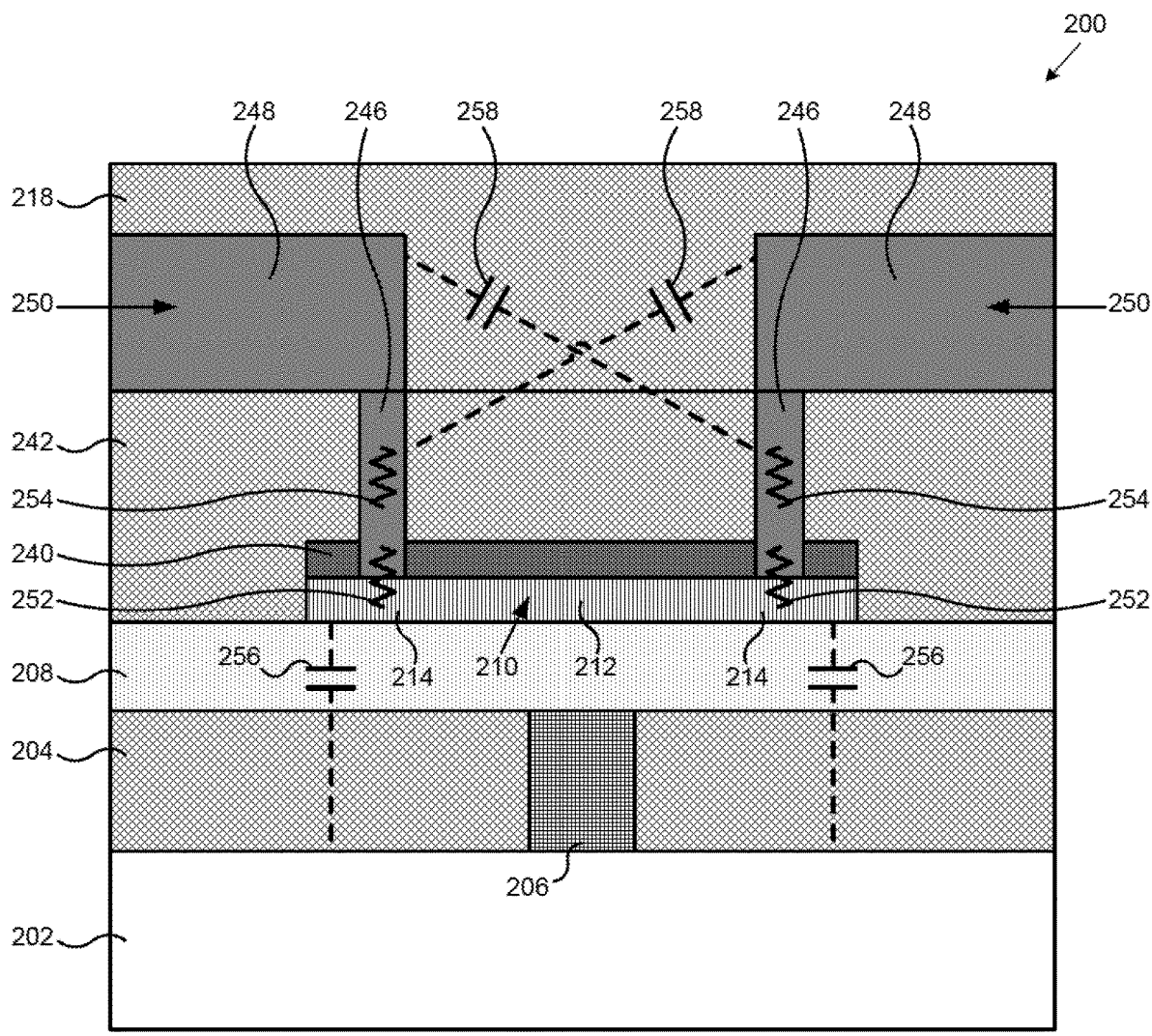
FIG. 2 illustrates a cross-sectional view of a portion of a PCM RF switch according to one implementation of the present application.

FIG. 2 illustrates a cross-sectional view of a portion of a PCM RF switch according to one implementation of the present application. As shown in FIG. 2, PCM RF switch 200 includes substrate 202, lower dielectric 204, upper dielectric 218, heating element 206, thermally conductive and electrically insulating layer 208, PCM 210 having active segment 212 and passive segments 214, contact uniformity support layer 240, contact dielectric 242, PCM contacts 250 having lower portions 246 and upper portions 248, resistors 252 and 254, and parasitic capacitors 256 and 258.

Substrate 202, lower dielectric 204, upper dielectric 218, heating element 206, thermally conductive and electrically insulating layer 208, and PCM 210 in PCM RF switch 200 in FIG. 2 are similar to corresponding structures in PCM RF switch 100 in FIG. 1, and may have any implementations and advantages described above. PCM RF switch 200 may include other structures not shown in FIG. 2.

Contact uniformity support layer 240 is situated over PCM 110. In one implementation, contact uniformity support layer 240 comprises silicon nitride, i.e. $Si_XN_Y$. In another implementation contact uniformity support layer 240 is a bi-layer that comprises oxide and nitride, such as $SiO_2$ under $Si_XN_Y$. Contact uniformity support layer 240 can be deposited, for example, by plasma enhanced CVD (PECVD) or high-density plasma CVD (HDP-CVD). In one implementation, contact uniformity support layer 240 can have a thickness of approximately fifty angstroms to approximately one thousand five hundred angstroms (50 Å-1500 Å).

In the present implementation, forming lower portions 246 of PCM contacts 250 may comprise two different etching actions. In the first etching action, contact dielectric 242 can be aggressively etched without having to accurately time the etching action. This etching action can use a selective etch, for example, a fluorine-based plasma dry etch, and contact uniformity support layer 240 can perform as an etch stop while contact dielectric 242 is selectively etched. In the second etching action, contact uniformity support layer 240 is punch-through etched. As used herein, "punch-through" refers to a short etching action that can be accurately timed to stop at the top surface of PCM 210. In PCM RF switch 200, lower portions 246 are narrow and contact uniformity support layer 240 is thin. Thus, only a small volume of contact uniformity support layer 240 is etched, and the punch-through etching action is short and can be accurately timed. In one implementation, a chlorine-based plasma dry etch is used for this etching action. Contact uniformity support layer 240 is optional in that the inventive concepts of the present application may be implemented without contact uniformity support layer 240, and lower portions 246 can extend through contact dielectric 242 into PCM 210. Because the $R_{ON}$ of PCM RF switch 200 depends heavily on the uniformity of contact made between PCM contacts 250 and PCM 210, the $R_{ON}$ will be significantly lower when contact uniformity support layer 240 is used.

Contact dielectric 242 is formed over PCM 210 and over contact uniformity support layer 240 (in case contact uniformity support layer 240 is used). Notably, contact dielectric 242 is also formed over thermally conductive and electrically insulating layer 208. In various implementations, contact dielectric 242 is $SiO_2$, boron-doped $SiO_2$, phosphorous-doped $SiO_2$, $Si_XN_Y$, or another dielectric. In various implementations, contact dielectric 242 is a low-k dielectric, such as fluorinated silicon dioxide, carbon-doped silicon oxide, or spin-on organic polymer. Contact dielectric 242 can be formed, for example, by PECVD, HDP-CVD, or spin-on processes. In one implementation, the thickness of contact dielectric 242 can range from approximately one half a micron to approximately two microns (0.5 μm-2 μm). In other implementations, contact dielectric 242 can have any other thicknesses. In one implementation, a thickness of contact dielectric 242 is significantly greater than a thickness of thermally conductive and electrically insulating layer 208. In one implementation, a thickness of contact dielectric 242 is significantly greater than a thickness of contact uniformity support layer 240.

Lower portions 246 of PCM contacts 250 extend through contact dielectric 242 and through contact uniformity support layer 240 (in case contact uniformity support layer 240 is used), and connect to passive segments 214 of PCM 210. Notably, lower portions 246 are narrow and connect to the top of PCM 210, not to the sidewalls of PCM 210. In one implementation, a metal layer is deposited in and over contact dielectric 242, and then planarized with contact dielectric 242, for example, using chemical machine polishing (CMP), thereby forming lower portions 246. In an alternative implementation, a single damascene process is used to form lower portions 246. In various implementations, lower portions 246 can comprise W, Al, or Cu. Lower portions 246 are part of PCM contacts 250 that provide RF signals to and from PCM 210. As described below, lower portions 246 can be uniform plate slot lower portions, or segmented lower portions.

Upper portions 248 are situated over contact dielectric 242 and over lower portions 246. Together, lower portions 246 and upper portions 248 make up PCM contacts 250 that provide RF signals to and from PCM 210. Upper portions 248 facilitate external connections for PCM RF switch 200 and also improve signal handling. In one implementation, a metal layer is deposited over contact dielectric 242 and over lower portions 246, and then a middle segment thereof overlying active segment 212 is etched, thereby forming upper portions 248. In an alternative implementation, a single damascene process is used to form upper portions 248. In various implementations, upper portions 248 can comprise W, Al, or Cu. In one implementation, lower portions 246 can comprise W, and upper portions 248 can comprise Al or Cu.

Although lower portions 246 and upper portions 248 are separate formations in FIG. 2, in other implementations they may be parts of the same formation. For example, lower portions 246 and upper portions 248 can be formed as a single metal using a dual damascene process. As another example, lower portions 246 and upper portions 248 can be formed as a single metal by depositing a metal layer in and over contact dielectric 242, and then etching a middle segment thereof overlying active segment 212. Notably, in these examples, lower portions 246 and upper portions 248 would not have a boundary interface. Although lower portions 246 and upper portions 248 are aligned in FIG. 2, in various implementations, upper portions 248 can have an offset towards active segment 212 of PCM 210 or can have an offset away from active segment 212 of PCM 210.

Utilizing contact dielectric 242 along with lower portions 246 and upper portions 248 of PCM contacts 250 improves both the thermal performance and the RF performance of PCM RF switch 200. Compared to PCM contacts 116 in FIG. 1, PCM contacts 250 in FIG. 2 have significantly reduced parasitic capacitance. Because contact dielectric 242 is situated over thermally conductive and electrically insulating layer 208, the wide bottom surface areas of upper portions 248 have increased separation from heating element 206 and substrate 202, and parasitic capacitance is reduced. In one implementation, parasitic capacitance of PCM RF switch 100 in FIG. 1 is approximately ten femto-Farads (10 fF), while parasitic capacitance of PCM RF switch 200 in FIG. 2 is approximately between a half of a femto-Farad and two femto-Farads (0.5 fF-2.0 fF).

Additionally, the thickness of contact dielectric 242 can be increased in order to reduce parasitic capacitance, without impacting heat transfer from heating element 206 to active segment 212 of PCM 210. Moreover, because contact dielectric 242 adjoins the sidewalls of PCM 210 and narrow lower portions 246 connect to the top of PCM 210, PCM contacts 250 do not sink significant amounts of heat from PCM 210. Less heat is required from heating element 206 in order to transform active segment 212 of PCM 210, and thus less power is required to switch between ON and OFF states.

Resistors 252 are formed by the interfaces of lower portions 246 and passive segments 214 of PCM 210. As described below, resistors 252 can represent a total plate slot interface resistance ($R_{PLATE-INT}$) or a total segmented interface resistance ($R_{SEG-INT}$). The resistance values of resistors 252 are generally governed by the materials of lower portions 246 and PCM 210, the dimensions of their interfaces, and the uniformity of contact at their interfaces. Accordingly, the resistance values of resistors 252 will be significantly lower when contact uniformity support layer 240 is used. Resistors 254 are formed by lower portions 246. As described below, resistors 254 can represent a total plate resistance ($R_{PLATE}$) or a total segmented resistance ($R_{SEG}$). The resistance values of resistors 254 are generally governed by the material of lower portions 246 and the dimensions of lower portions 246. Resistors 252 and resistors 254 both contribute to the total $R_{ON}$ of PCM RF switch 200. Notably, in FIG. 2 lower portions 246 of PCM contacts 250 are narrow. In one implementation, the width of lower portions 246 of PCM contacts 250 can be a minimum process size.

Parasitic capacitors 256 are formed between PCM 210 and substrate 202. Parasitic capacitors 256 together represent a total capacitance ($C_{PCM}$) of PCM 210 to substrate 202. The capacitance values of parasitic capacitors 256 are generally governed by the dimensions of PCM 210 and substrate 202, the distance between them, and the material between them. Parasitic capacitors 258 are formed between upper portions 248 and opposite lower portions 246. As described below, parasitic capacitors 258 can represent a total capacitance ($C_{UPPER}$) of upper portions 248 to uniform plate slot lower portions, or to segmented lower portions. The capacitance values of parasitic capacitors 258 are generally governed by the dimensions of upper portions 248 and lower portions 246, the distance between them, and the material between them. Parasitic capacitors 256 and parasitic capacitors 258 both contribute to the total $C_{OFF}$ of PCM RF switch 200.

Figure 3A:
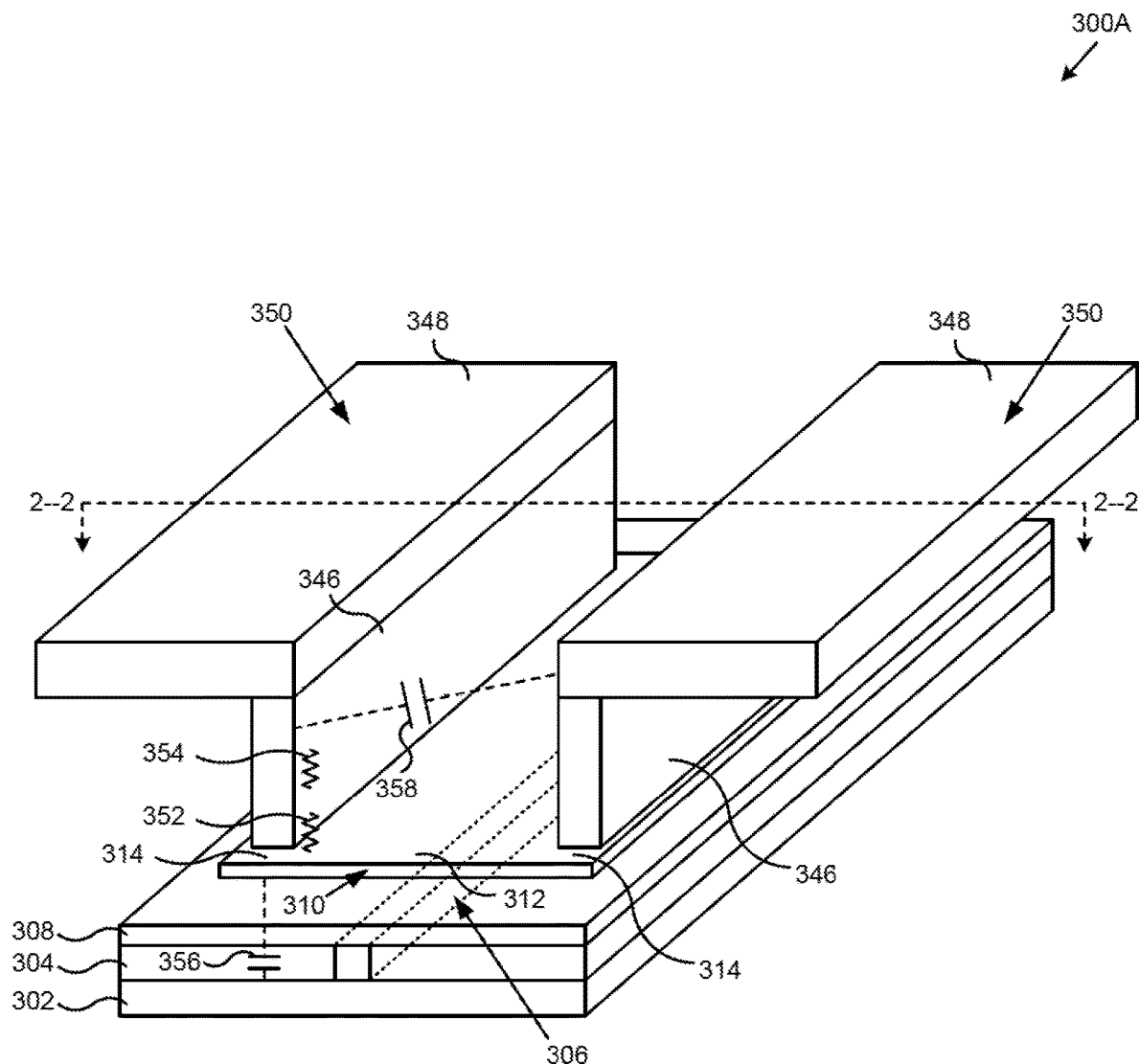
FIG. 3A illustrates a perspective view of a portion of a PCM RF switch according to one implementation of the present application.

FIG. 3A illustrates a perspective view of a portion of a PCM RF switch according to one implementation of the present application. PCM RF switch 200 in FIG. 2 can represent a cross-sectional view along line "2-2" of PCM RF switch 300A in FIG. 3A. As shown in FIG. 3A, PCM RF switch 300A includes substrate 302, lower dielectric 304, heating element 306, thermally conductive and electrically insulating layer 308, PCM 310 having active segment 312 and passive segments 314, PCM contacts 350 having uniform plate slot lower portions 346 and upper portions 348, resistors 352 and 354, and parasitic capacitors 356 and 358. Heating element 306 is illustrated with dashed lines as seen through various structures of PCM RF switch 300A.

Substrate 302, lower dielectric 304, heating element 306, thermally conductive and electrically insulating layer 308, and PCM 310 in PCM RF switch 300A in FIG. 3A are similar to corresponding structures in PCM RF switch 200 in FIG. 2, and may have any implementations and advantages described above. PCM RF switch 300A may include other structures not shown in FIG. 3A, such as a contact uniformity support layer or a contact dielectric.

PCM RF switch 300A includes PCM contacts 350 having uniform plate slot lower portions 346. As used herein, "slot" refers to the lengths of lower portions 346 in the direction parallel to heating element 306 being significantly greater than the widths of lower portions 346 in the direction transverse to heating element 306. In one implementation, the lengths of lower portions 346 are at least twenty times greater than their widths. Thus, lower portions 346 appear to create slots between upper portions 348 and passive segments 314 of PCM 310. As used herein, "uniform plate" refers to lower portions 346 being substantially continuous, rather than segmented.

Resistor 352 represents the resistance between one of uniform plate slot lower portions 346 and one of passive segments 314 of PCM 310. Resistor 352 represents half of the total plate slot interface resistance ($R_{PLATE-INT}$) of uniform plate slot lower portions 346. Another resistor (not shown in FIG. 3A) corresponding to the other one of uniform plate slot lower portions 346 would represent the other half of the total plate slot interface resistance ($R_{PLATE-INT}$).

Resistor 354 represents the resistance of one of uniform plate slot lower portions 346. Resistor 354 represents half of the total plate resistance ($R_{PLATE}$) of uniform plate slot lower portions 346. Another resistor (not shown in FIG. 3A) corresponding to the other one of uniform plate slot lower portions 346 would represent the other half of the total plate resistance ($R_{PLATE}$).

Parasitic capacitor 356 represents half of the total capacitance ($C_{PCM}$) of PCM 310 to substrate 302. Another parasitic capacitor 356 (not shown in FIG. 3A) would represents the other half of the total capacitance ($C_{PCM}$) of PCM 310 to substrate 302. The two parasitic capacitors 356 (only one of which is shown in FIG. 3A) together would represent the total capacitance ($C_{PCM}$) of PCM 310 to substrate 302. Parasitic capacitor 358 represents the capacitance of one of upper portions 348 to an opposite one of uniform plate slot lower portions 346. Parasitic capacitor 358 represents half of the total capacitance ($C_{UPPER}$) of upper portions 348 to uniform plate slot lower portions 346. Another parasitic capacitor (not shown in FIG. 3A) corresponding to the other one of upper portions 348 would represent the other half of the total capacitance ($C_{UPPER}$) of upper portions 348.

PCM contacts 350 having uniform plate slot lower portions 346 significantly reduce a product of ($R_{PLATE}$+$R_{PLATE-INT}$) and ($C_{UPPER}$+$C_{PCM}$). Because uniform plate slot lower portions 346 are continuous uniform plates and relatively long slots, both $R_{PLATE}$ and $R_{PLATE-INT}$ are reduced. Also because uniform plate slot lower portions 346 are continuous uniform plates and relatively long slots, current crowding is reduced at corners of uniform plate slot lower portions 346 nearest active segment 312 of PCM 310. $R_{PLATE-INT}$ is further reduced where contact uniformity support layer 240 (shown in FIG. 2) is used. Moreover, as described below, because uniform plate slot lower portions 346 are narrow plates, the area of PCM 310 is reduced, thus reducing $C_{PCM}$. Significantly reducing the product of ($R_{PLATE}$+$R_{PLATE-INT}$) and ($C_{UPPER}$+$C_{PCM}$) in PCM RF switch 300A correspondingly reduces the product of $R_{ON}$ and $C_{OFF}$ figure of merit, improving characteristic performance of PCM RF switch 300A.

Figure 3B:
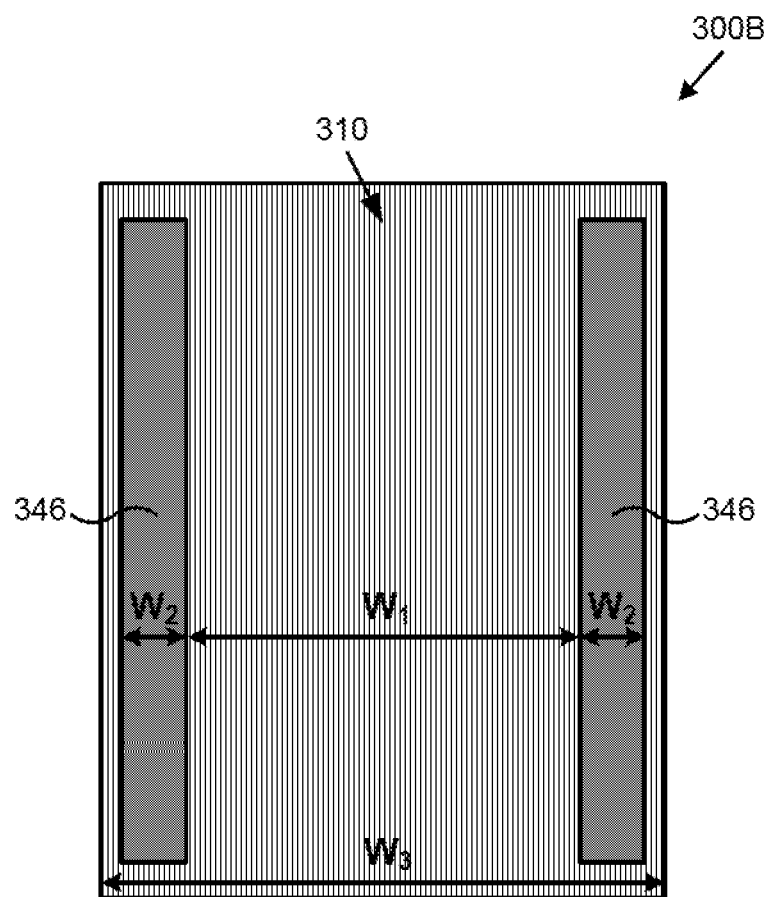
FIG. 3B illustrates a top view of a portion of a PCM RF switch corresponding to the PCM RF switch of FIG. 3A according to one implementation of the present application.

FIG. 3B illustrates a top view of a portion of a PCM RF switch corresponding to the PCM RF switch of FIG. 3A according to one implementation of the present application. Only PCM 310 and uniform plate slot lower portions 346 are shown in the top view of PCM RF switch 300B in FIG. 3B.

Width $W_1$ between respective uniform plate slot lower portions 346 represents the width of the active segment of PCM RF switch 300B. Width $W_1$ can be given as a design criteria. Width $W_2$ is the width of one of uniform plate slot lower portions 346. In the present implementation, width $W_2$ is small, and uniform plate slot lower portions 346 are narrow plates. In one implementation, width $W_2$ can be a minimum process size. Width $W_3$ is the width of the entire PCM 310 (i.e. the combined widths of the active segment and the passive segments of the PCM). As shown in FIG. 3B, width $W_3$ of PCM 310 is approximately equal to width $W_1$ plus the widths of uniform plate slot lower portions 346, plus any margin of error needed for forming uniform plate slot lower portions 346 ($W_3 \approx W_1 + 2W_2$). Because uniform plate slot lower portions 346 are narrow plates, the width $W_3$ of PCM 310 is minimized. The area of PCM 310 is thus reduced, in turn reducing $C_{PCM}$ (i.e., reducing parasitic capacitors 256 in FIG. 2).

Figure 4:
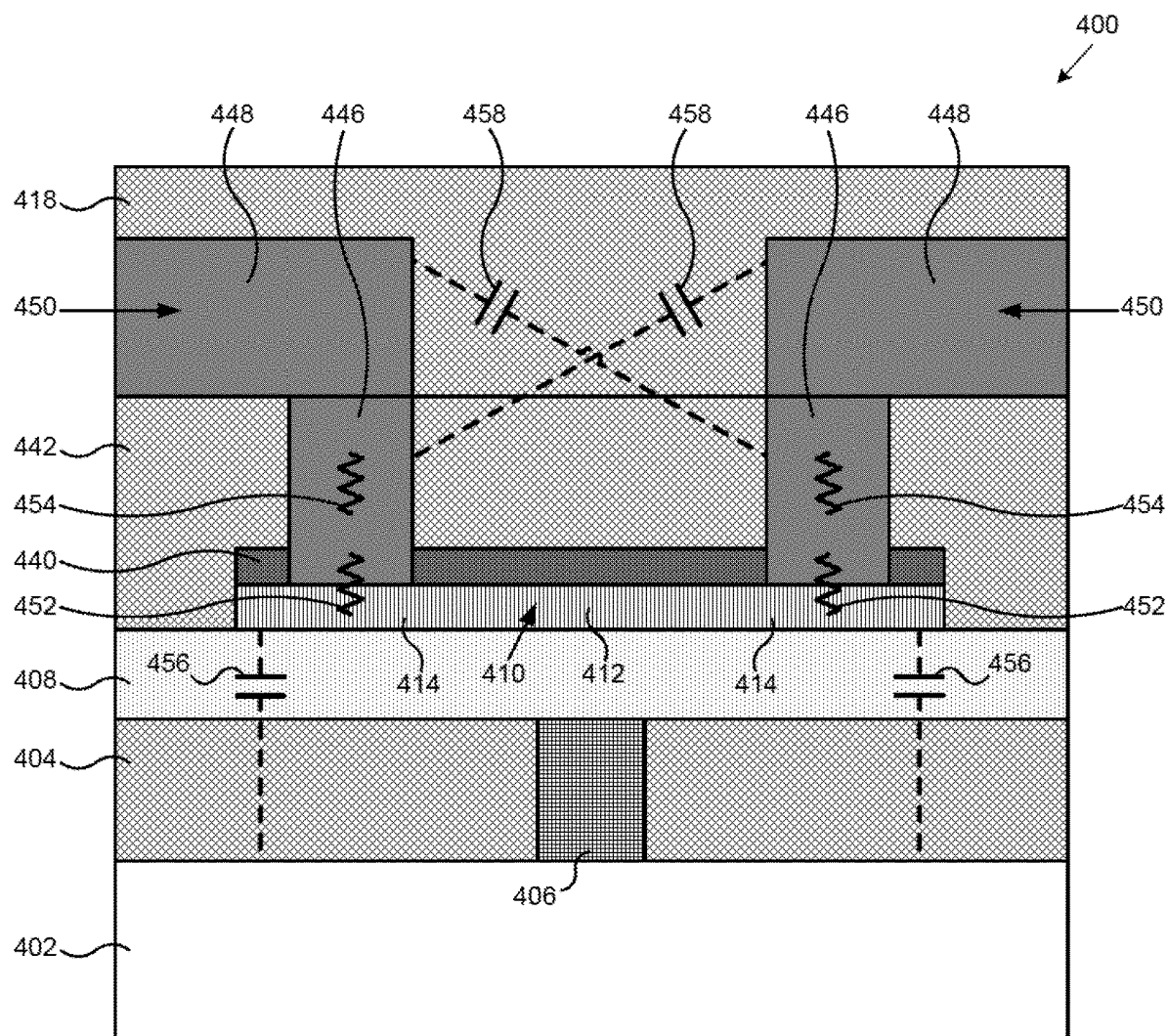
FIG. 4 illustrates a cross-sectional view of a portion of a PCM RF switch according to one implementation of the present application.

FIG. 4 illustrates a cross-sectional view of a portion of a PCM RF switch according to one implementation of the present application. As shown in FIG. 4, PCM RF switch 400 includes substrate 402, lower dielectric 404, upper dielectric 418, heating element 406, thermally conductive and electrically insulating layer 408, PCM 410 having active segment 412 and passive segments 414, contact uniformity support layer 440, contact dielectric 442, PCM contacts 450 having lower portions 446 and upper portions 448, resistors 452 and 454, and parasitic capacitors 456 and 458.

Substrate 402, lower dielectric 404, upper dielectric 418, heating element 406, thermally conductive and electrically insulating layer 408, PCM 410, contact uniformity support layer 440, contact dielectric 442, resistors 452 and 454, and parasitic capacitors 456 and 458 in PCM RF switch 400 in FIG. 4 are similar to corresponding structures in PCM RF switch 200 in FIG. 2, and may have any implementations and advantages described above. PCM RF switch 400 may include other structures not shown in FIG. 4.

Lower portions 446 of PCM contacts 450 in FIG. 4 are wider than lower portions 246 of PCM contact 250 in FIG. 2. In various implementations, the width of lower portions 446 of PCM contacts 450 can be twice a minimum process size or wider. The width of PCM 410 in FIG. 4, which lower portions 446 connect to, is also wider than the width of PCM 210 in FIG. 2. As described below, lower portions 446 can be uniform plate slot lower portions, or segmented lower portions. Also as described below, where lower portions 446 are wider, the resistance values of resistors 452 and 454 are reduced, reducing $R_{PLATE}$ and $R_{PLATE\text{-}INT}$, or reducing $R_{SEG}$ and $R_{SEG\text{-}INT}$.

Figure 5A:
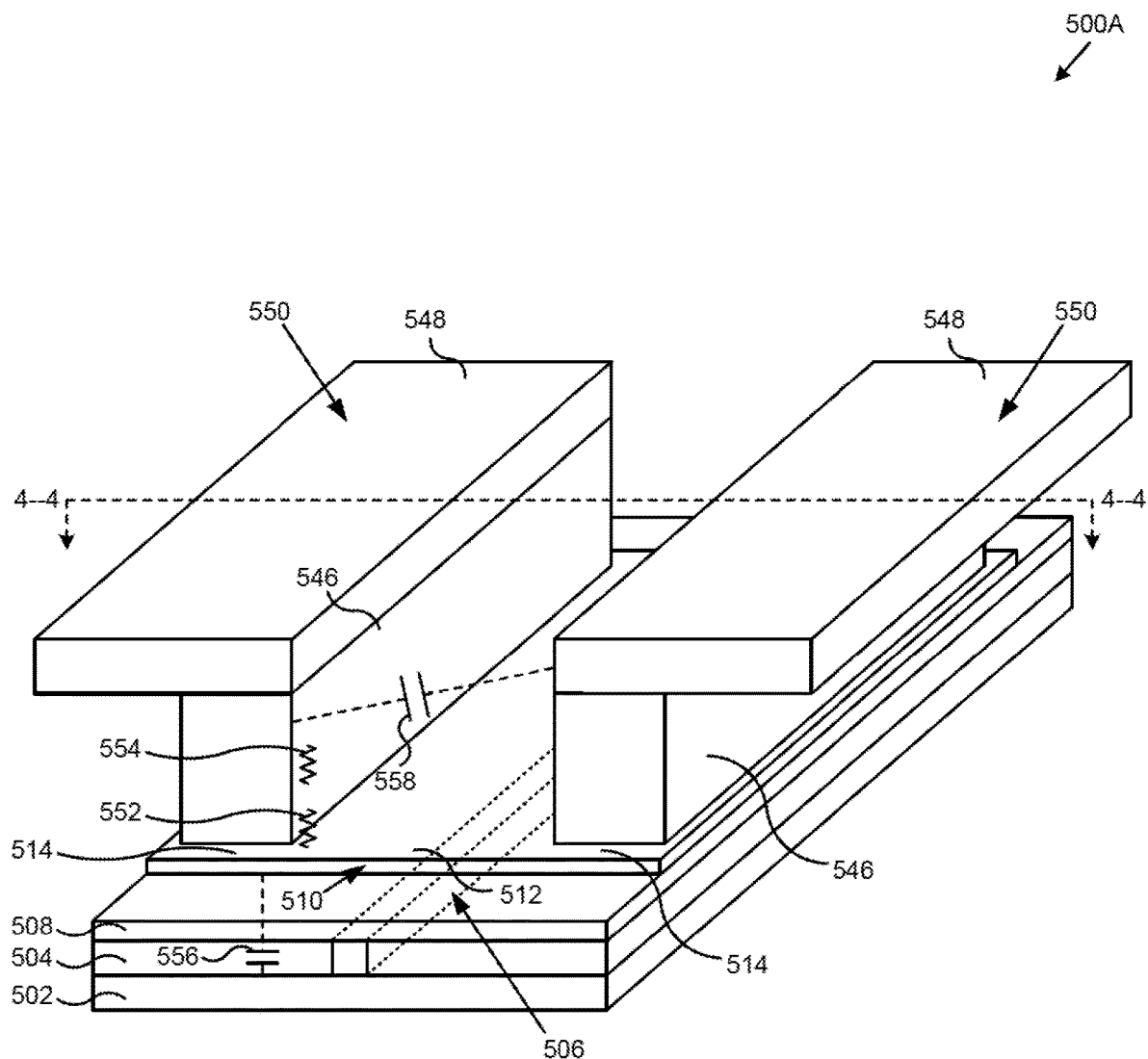
FIG. 5A illustrates a perspective view of a portion of a PCM RF switch according to one implementation of the present application.

FIG. 5A illustrates a perspective view of a portion of a PCM RF switch according to one implementation of the present application. PCM RF switch 400 in FIG. 4 can represent a cross-sectional view along line "4-4" of PCM RF switch 500A in FIG. 5A. As shown in FIG. 5A, PCM RF switch 500A includes substrate 502, lower dielectric 504, heating element 506, thermally conductive and electrically insulating layer 508, PCM 510 having active segment 512 and passive segments 514, PCM contacts 550 having uniform plate slot lower portions 546 and upper portions 548, resistors 552 and 554, and parasitic capacitors 556 and 558. Heating element 506 is illustrated with dashed lines as seen through various structures of PCM RF switch 500A.

Substrate 502, lower dielectric 504, heating element 506, thermally conductive and electrically insulating layer 508, resistors 552 and 554, and parasitic capacitors 556 and 558 in PCM RF switch 500A in FIG. 5A are similar to corresponding structures in PCM RF switch 300A in FIG. 3A, and may have any implementations and advantages described above. PCM RF switch 500A may include other structures not shown in FIG. 5A, such as a contact uniformity support layer or a contact dielectric. Notably, PCM 510 and uniform plate slot lower portions 546 of PCM contacts 550 in FIG. 5A are wider than their corresponding structures in FIG. 3A.

PCM contacts 550 having uniform plate slot lower portions 546 significantly reduce a product of ($R_{PLATE} + R_{PLATE\text{-}INT}$) and ($C_{UPPER} + C_{PCM}$). Because uniform plate slot lower portions 546 are continuous uniform plates and relatively long slots, both $R_{PLATE}$ and $R_{PLATE\text{-}INT}$ are reduced. Also because uniform plate slot lower portions 546 are continuous uniform plates and relatively long slots, current crowding is reduced at corners of uniform plate slot lower portions 546 nearest active segment 512 of PCM 510. $R_{PLATE\text{-}INT}$ is further reduced where contact uniformity support layer 240 (shown in FIG. 2) is used. Moreover, as described below, because uniform plate slot lower portions 546 are wide plates, both $R_{PLATE}$ and $R_{PLATE\text{-}INT}$ are further reduced. Significantly reducing the product of ($R_{PLATE} + R_{PLATE\text{-}INT}$) and ($C_{UPPER} + C_{PCM}$) in PCM RF switch 500A correspondingly reduces the product of $R_{ON}$ and $C_{OFF}$ figure of merit, improving characteristic performance of PCM RF switch 500A.

Figure 5B:
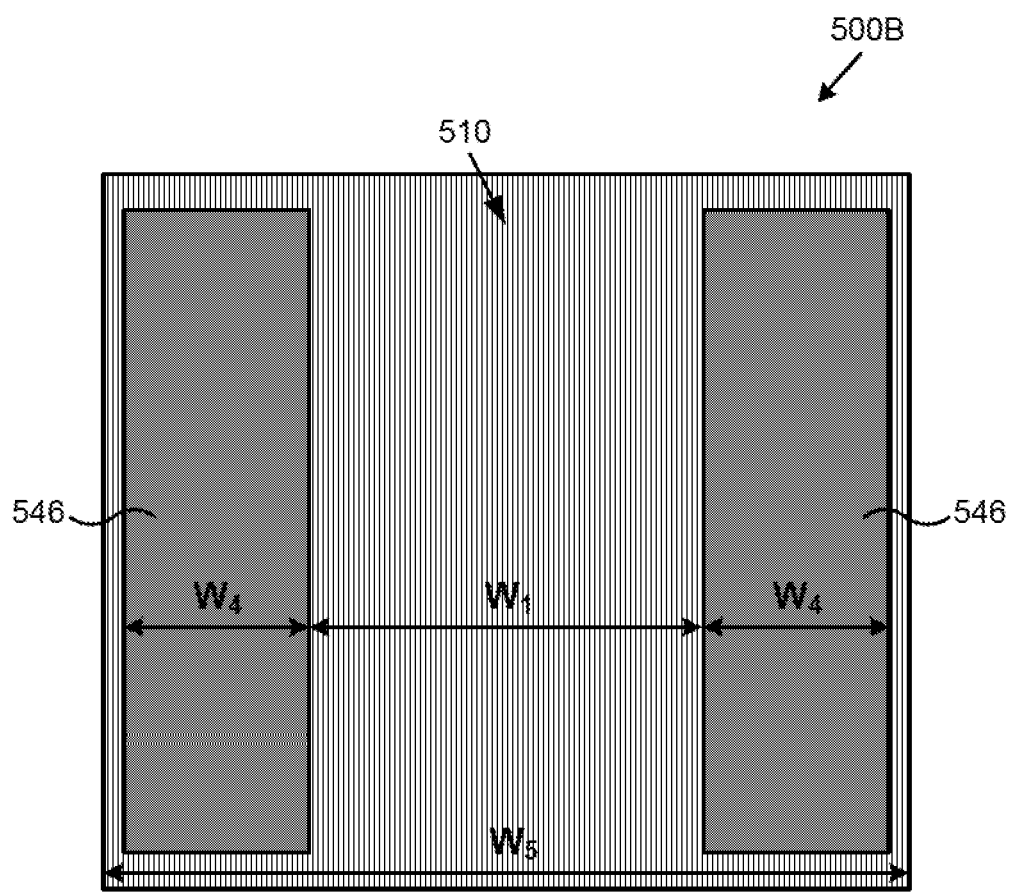
FIG. 5B illustrates a top view of a portion of a PCM RF switch corresponding to the PCM RF switch of FIG. 5A according to one implementation of the present application.

FIG. 5B illustrates a top view of a portion of a PCM RF switch corresponding to the PCM RF switch of FIG. 5A according to one implementation of the present application. Only PCM 510 and uniform plate slot lower portions 546 are shown in the top view of PCM RF switch 500B in FIG. 5B.

Width $W_1$ between respective uniform plate slot lower portions 546 represents the width of the active segment of PCM RF switch 500B. Width $W_1$ can be given as a design criteria. Width $W_4$ is the width of one of uniform plate slot lower portions 546. In the present implementation, width $W_4$ is large, and uniform plate slot lower portions 546 are wide plates. In one implementation, width $W_4$ can be twice a minimum process size or wider. Width $W_5$ is the width of the entire PCM 510. As shown in FIG. 5B, width $W_5$ of PCM 510 is approximately equal to width $W_1$ plus the widths of uniform plate slot lower portions 546, plus any margin of error needed for forming uniform plate slot lower portions 546 ($W_5 \approx W_1 + 2W_4$). Because uniform plate slot lower portions 546 are wide plates, $R_{PLATE}$ is reduced. Also because uniform plate slot lower portions 546 are wide plates, the interface area of uniform plate slot lower portions 546 and PCM 510 is reduced, reducing $R_{PLATE\text{-}INT}$ (i.e., reducing resistors 454 and 452 in FIG. 4). It is noted that the total resistance represented by $R_{PLATE} + R_{PLATE\text{-}INT}$ is lower in the implementation of FIGS. 5A/5B relative to $R_{PLATE} + R_{PLATE\text{-}INT}$ in the implementation of FIGS. 3A/3B. However, due to the fact that width $W_5$ of PCM 510 in the implementation of FIGS. 5A/5B is greater than width $W_3$ of PCM 310 in the implementation of FIGS. 3A/3B, parasitic capacitors 556 (i.e. total capacitance ($C_{PCM}$) of PCM 510 to substrate 502) are greater than parasitic capacitors 356 (i.e. total capacitance ($C_{PCM}$) of PCM 310 to substrate 302).

Figure 6A:
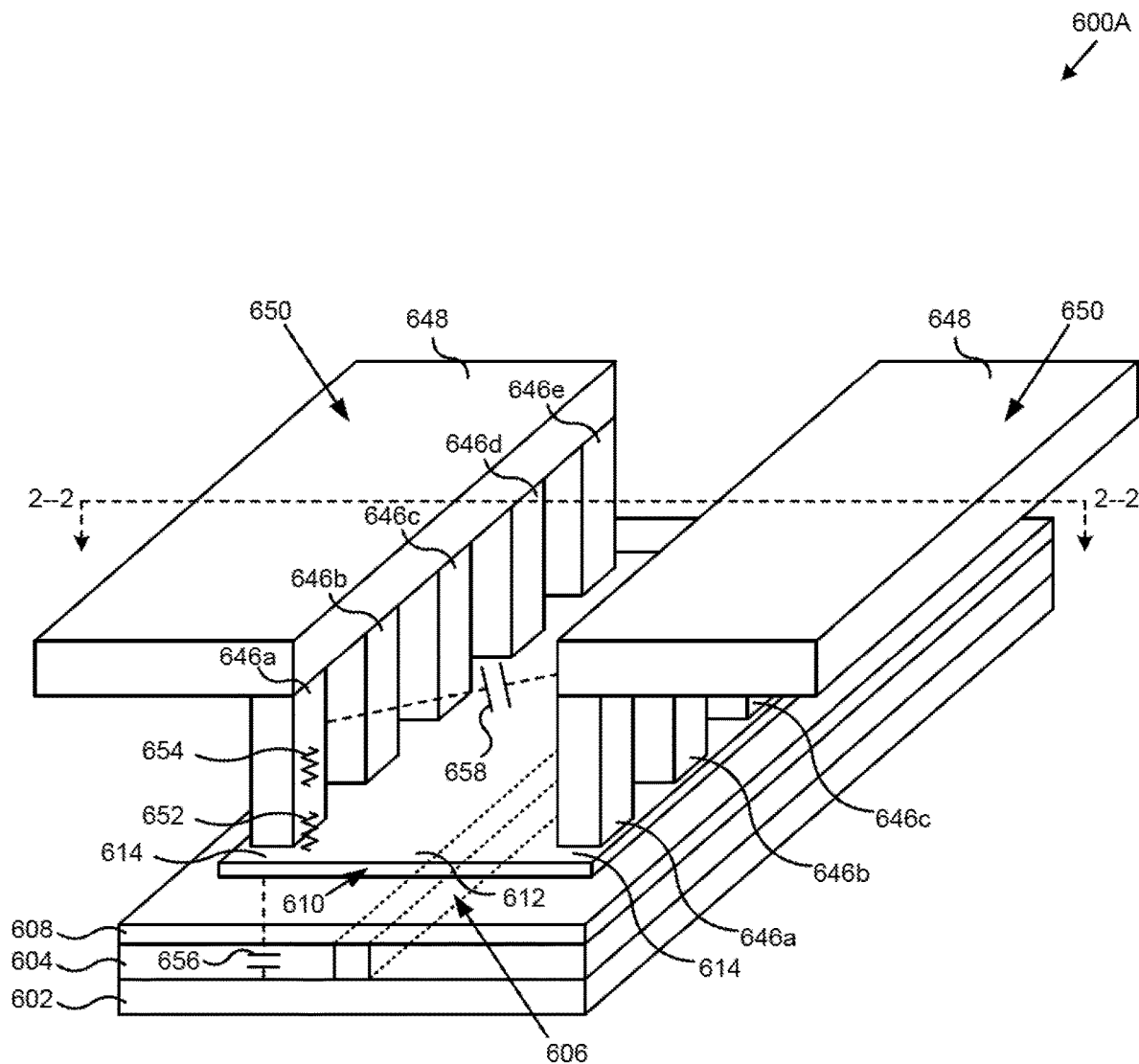
FIG. 6A illustrates a perspective view of a portion of a PCM RF switch according to one implementation of the present application.

FIG. 6A illustrates a perspective view of a portion of a PCM RF switch according to one implementation of the present application. PCM RF switch 200 in FIG. 2 can represent a cross-sectional view along line "2-2" of PCM RF switch 600A in FIG. 6A. As shown in FIG. 6A, PCM RF switch 600A includes substrate 602, lower dielectric 604, heating element 606, thermally conductive and electrically insulating layer 608, PCM 610 having active segment 612 and passive segments 614, PCM contacts 650 having segmented lower portions 646a, 646b, 646c. 646d, and 646e (collectively referred to as segmented lower portions 646) and upper portions 648, resistors 652 and 654, and parasitic capacitors 656 and 658. Heating element 606 is illustrated with dashed lines as seen through various structures of PCM RF switch 600A.

Substrate 602, lower dielectric 604, heating element 606, thermally conductive and electrically insulating layer 608, and PCM 610 in PCM RF switch 600A in FIG. 6A are similar to corresponding structures in PCM RF switch 300A in FIG. 3A, and may have any implementations and advantages described above. PCM RF switch 600A may include other structures not shown in FIG. 6A, such as a contact uniformity support layer or a contact dielectric.

PCM RF switch 600A includes PCM contacts 650 having segmented lower portions 646. As used herein. "segmented" lower portions refer to lower portions that are not continuous and comprise multiple segments that connect to the PCM below and the upper portion above, and thus the segmented lower portions are electrically shorted to each other. In FIG. 6A, segmented lower portions 646 are square segments.

Resistor 652 represents the resistance between one of segmented lower portions 646a and one of passive segments 614 of PCM 610. In the present implementation, resistor 652 is combined in parallel with other similar resistors of other segments to result in a total segmented interface resistance ($R_{SEG-INT}$) of segmented lower portions 646. The total segmented interface resistance ($R_{SEG-INT}$) in the example of FIG. 6A is about one-tenth of resistance of individual resistor 652. Another resistor (not shown in FIG. 6A) corresponding to the other one of segmented lower portions 646a, along with other resistors (not shown in FIG. 6A) corresponding to segmented lower portions 646b, 646c, 646d, and 646e, would represent the remaining resistors that combine in parallel to result in the total segmented interface resistance ($R_{SEG-INT}$).

Resistor 654 represents the resistance of one of segmented lower portions 646a. In the present implementation, resistor 654 is combined in parallel with other similar resistors of other segments to result in a total segmented resistance ($R_{SEG}$) of segmented lower portions 646. The total segmented resistance ($R_{SEG}$) in the example of FIG. 6A is about one-tenth of resistance of individual resistor 654. Another resistor (not shown in FIG. 6A) corresponding to the other one of segmented lower portions 646a, along with other resistors (not shown in FIG. 6A) corresponding to segmented lower portions 646b, 646c, 646d, and 646e, would represent the remaining resistors that combine in parallel to result in the total segmented resistance ($R_{SEG}$).

Parasitic capacitor 656 represents half of the total capacitance ($C_{PCM}$) of PCM 610 to substrate 602. Another parasitic capacitor 656 (not shown in FIG. 6A) would represents the other half of the total capacitance ($C_{PCM}$) of PCM 610 to substrate 602. The two parasitic capacitors 656 (only one of which is shown in FIG. 6A) together would represent the total capacitance ($C_{PCM}$) of PCM 610 to substrate 602. Parasitic capacitor 658 represents the capacitance of one of upper portions 648 to an opposite one of segmented lower portions 646a. In the present implementation, parasitic capacitor 658 represents about one tenth of the total capacitance ($C_{UPPER}$) of upper portions 648 to segmented lower portions 646. Another parasitic capacitor (not shown in FIG. 6A) corresponding to the other one segmented lower portions 646a, along with other parasitic capacitors (not shown in FIG. 6A) corresponding to segmented lower portions 646b, 646c, 646d, and 646e, would represent the remainder of the total capacitance ($C_{UPPER}$) of upper portions 648.

Because segmented lower portions 646 are not continuous, less area is available to capacitively couple with opposite upper portions 648, relative to uniform plate slot lower portions 346 in FIG. 3A. As a result. PCM contacts 650 having segmented lower portions 646 significantly reduce parasitic capacitance $C_{UPPER}$ (i.e., reduce parasitic capacitors 258 in FIG. 2), relative to uniform plate slot lower portions 346 in FIG. 3A. Significantly reducing $C_{UPPER}$ in PCM RF switch 600A correspondingly reduces the $C_{OFF}$ figure of merit, improving characteristic performance of PCM RF switch 600A.

Figure 6B:
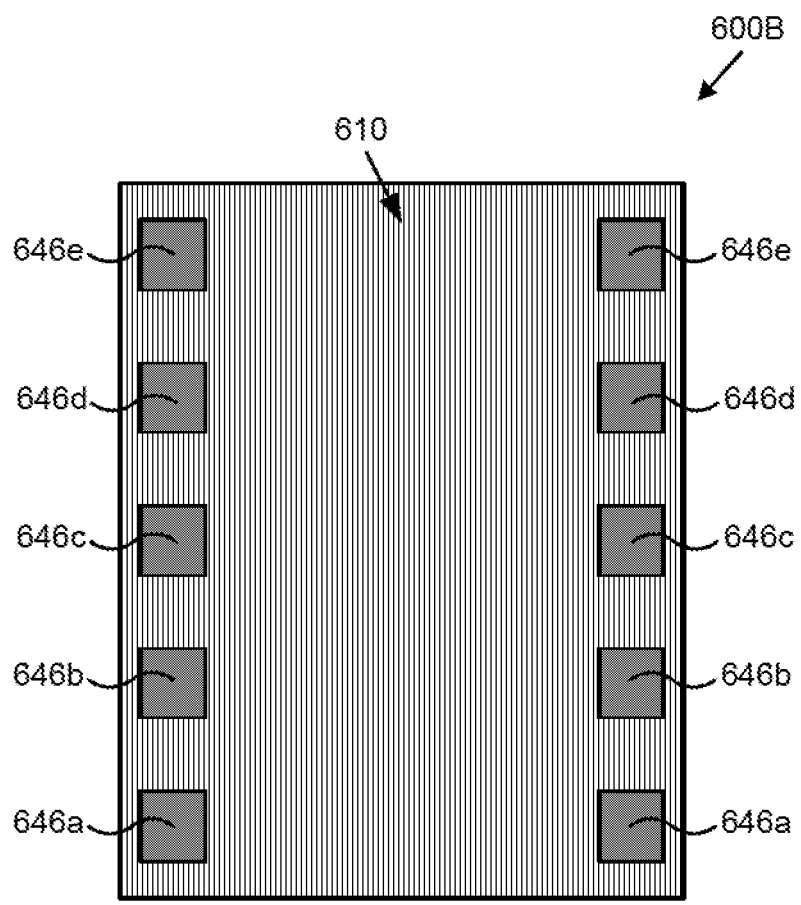
FIG. 6B illustrates a top view of a portion of a PCM RF switch corresponding to the PCM RF switch of FIG. 6A according to one implementation of the present application.

FIG. 6B illustrates a top view of a portion of a PCM RF switch corresponding to the PCM RF switch of FIG. 6A according to one implementation of the present application. Only PCM 610 and segmented lower portions 646a, 646b, 646c, 646d, and 646e (collectively referred to as segmented lower portions 646) are shown in the top view of PCM RF switch 600B in FIG. 6B.

As shown in FIG. 6B, segmented lower portions 646 are square segments. In one implementation, the length and width of segmented lower portions 646 can be a minimum process size. As described above, because segmented lower portions 646 are not continuous, less area is available to couple and parasitic capacitance $C_{UPPER}$ is significantly reduced.

Figure 7A:
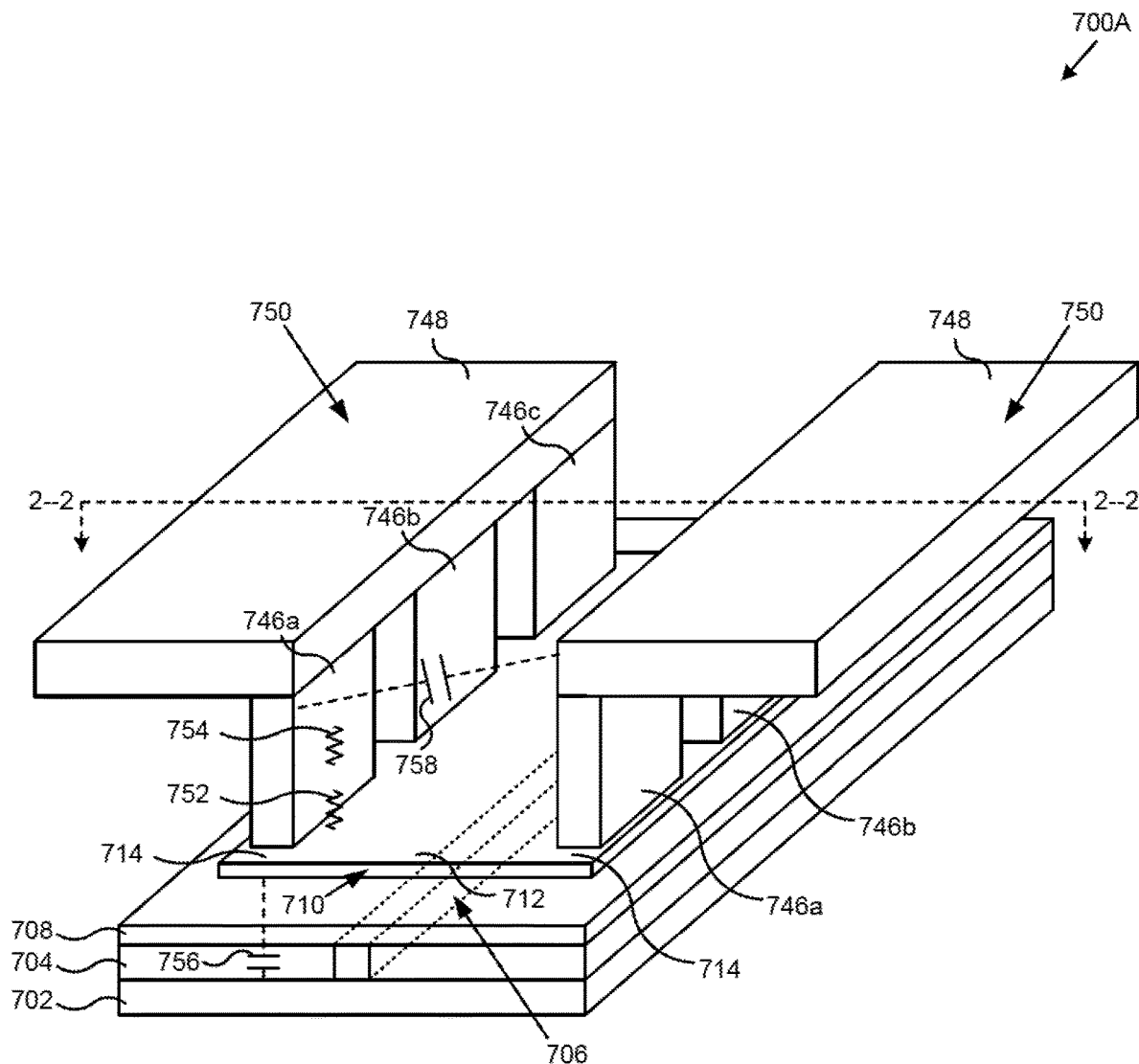
FIG. 7A illustrates a perspective view of a portion of a PCM RF switch according to one implementation of the present application.

FIG. 7A illustrates a perspective view of a portion of a PCM RF switch according to one implementation of the present application. PCM RF switch 200 in FIG. 2 can represent a cross-sectional view along line "2-2" of PCM RF switch 700A in FIG. 7A. As shown in FIG. 7A, PCM RF switch 700A includes substrate 702, lower dielectric 704, heating element 706, thermally conductive and electrically insulating layer 708, PCM 710 having active segment 712 and passive segments 714, PCM contacts 750 having segmented lower portions 746a, 746b, and 746c (collectively referred to as segmented lower portions 746) and upper portions 748, resistors 752 and 754, and parasitic capacitors 756 and 758. Heating element 706 is illustrated with dashed lines as seen through various structures of PCM RF switch 700A.

Substrate 702, lower dielectric 704, heating element 706, thermally conductive and electrically insulating layer 708, PCM 710, resistors 752 and 754, and parasitic capacitors 756 and 758 in PCM RF switch 700A in FIG. 7A are similar to corresponding structures in PCM RF switch 600A in FIG. 6A, and may have any implementations and advantages described above. PCM RF switch 700A may include other structures not shown in FIG. 7A, such as a contact uniformity support layer or a contact dielectric.

PCM RF switch 700A includes PCM contacts 750 having segmented lower portions 746. In FIG. 7A, segmented lower portions 746 are rectangular segments. Segmented lower portions 746 are laid out length-wise over PCM 710 (i.e., parallel to heating element 706).

Resistor 752 represents the resistance between one of segmented lower portions 746a and one of passive segments 714 of PCM 710. In the present implementation, resistor 752 is combined in parallel with other similar resistors of other segments to result in a total segmented interface resistance ($R_{SEG-INT}$) of segmented lower portions 746. The total segmented interface resistance ($R_{SEG-INT}$) in the example of FIG. 7A is about one-sixth of resistance of individual resistor 752. Another resistor (not shown in FIG. 7A) corresponding to the other one of segmented lower portions 746a, along with other resistors (not shown in FIG. 7A) corresponding to segmented lower portions 746b and 746c, would represent the remaining resistors that combine in parallel to result in the total segmented interface resistance ($R_{SEG-INT}$).

Resistor 754 represents the resistance of one of segmented lower portions 746a. In the present implementation, resistor 754 is combined in parallel with other similar resistors of other segments to result in a total segmented resistance ($R_{SEG}$) of segmented lower portions 746. The total segmented resistance ($R_{SEG}$) in the example of FIG. 7A is about one-sixth of resistance of individual resistor 754. Another resistor (not shown in FIG. 7A) corresponding to the other one of segmented lower portions 746a, along with other resistors (not shown in FIG. 7A) corresponding to segmented lower portions 746b and 746c, would represent the remaining resistors that combine in parallel to result in the total segmented resistance ($R_{SEG}$).

Parasitic capacitor 756 represents half of the total capacitance ($C_{PCM}$) of PCM 710 to substrate 702. Another parasitic capacitor 756 (not shown in FIG. 7A) would represents the other half of the total capacitance ($C_{PCM}$) of PCM 710 to substrate 702. The two parasitic capacitors 756 (only one of which is shown in FIG. 7A) together would represent the total capacitance ($C_{PCM}$) of PCM 710 to substrate 702. Parasitic capacitor 758 represents the capacitance of one of upper portions 748 to an opposite one of segmented lower portions 746a. In the present implementation, parasitic capacitor 758 represents about one sixth of the total capacitance ($C_{UPPER}$) of upper portions 748 to segmented lower portions 746. Another parasitic capacitor (not shown in FIG. 7A) corresponding to the other one segmented lower portions 746a, along with other parasitic capacitors (not shown in FIG. 7A) corresponding to segmented lower portions 746b and 746c, would represent the remainder of the total capacitance ($C_{UPPER}$) of upper portions 748.

Because segmented lower portions 746 in FIG. 7A are not continuous, less area is available to couple with opposite upper portions 748, relative to uniform plate slot lower portions 346 in FIG. 3A. As a result, segmented lower portions 746 in FIG. 7A significantly reduce $C_{UPPER}$ (i.e., reduce parasitic capacitors 258 in FIG. 2), relative to uniform plate slot lower portions 346 in FIG. 3A. Additionally, because segmented lower portions 746 in FIG. 7A are rectangular segments that are laid out length-wise over PCM 710, segmented lower portions 746 are larger, and the interface area of segmented lower portions 746 and PCM 710 is larger, relative to segmented lower portions 646 in FIG. 6A. As a result, segmented lower portions 746 in FIG. 7A reduce the total $R_{SEG}$ and $R_{SEG-INT}$ (i.e., reduce resistors 254 and 252 in FIG. 2), relative to segmented lower portions 646 in FIG. 6A. Improving $R_{SEG}$, $R_{SEG-INT}$, and $C_{UPPER}$ as shown in FIG. 7A can optimize a product of $R_{ON}$ and $C_{OFF}$ figure of merit for PCM RF switch 700A, especially where more weight is given to $R_{ON}$, relative to PCM RF switch 600A in FIG. 6A.

It is noted that although segmented lower portions 746 in FIG. 7A significantly reduce $C_{UPPER}$ (i.e., reduce parasitic capacitors 258 in FIG. 2), relative to uniform plate slot lower portions 346 in FIG. 3A, the reduction in $C_{UPPER}$ in the configuration of FIG. 6A (i.e. using square segments) is more significant than the reduction of $C_{UPPER}$ in FIG. 7A (i.e. length-wise rectangular segments) since the total surface area of segmented lower portions 746 in FIG. 7A for capacitive coupling with upper portions 748 is greater than the total surface area of segmented lower portions 646 in FIG. 6A for capacitive coupling with upper portions 648.

Figure 7B:
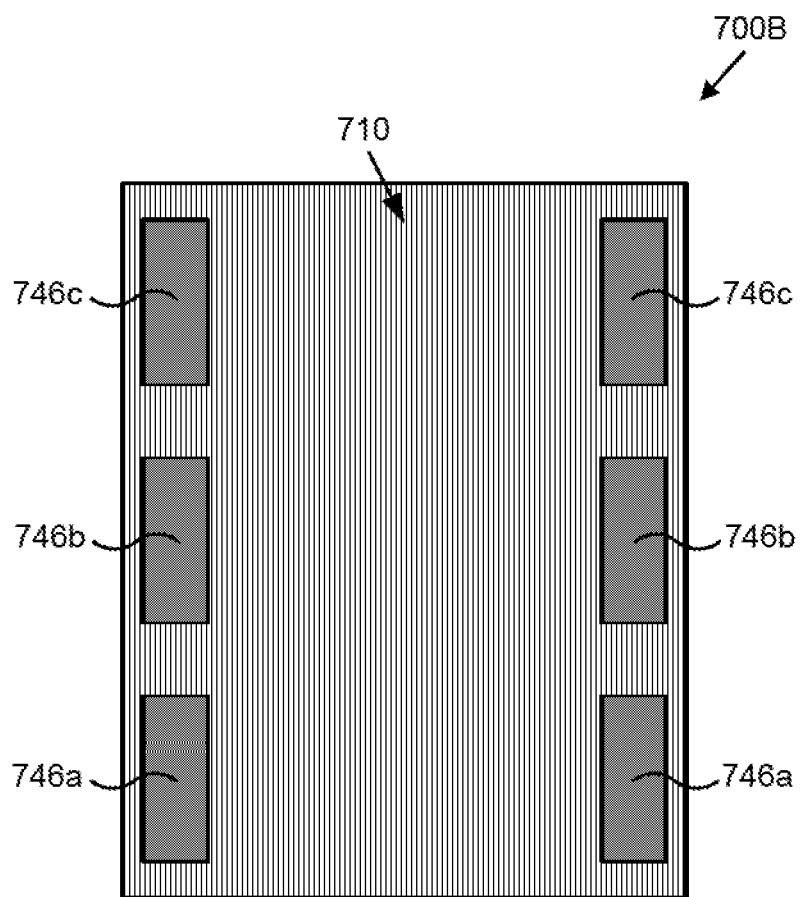
FIG. 7B illustrates a top view of a portion of a PCM RF switch corresponding to the PCM RF switch of FIG. 7A according to one implementation of the present application.

FIG. 7B illustrates a top view of a portion of a PCM RF switch corresponding to the PCM RF switch of FIG. 7A according to one implementation of the present application. Only PCM 710 and segmented lower portions 746a, 746b, and 746c (collectively referred to as segmented lower portions 746) are shown in the top view of PCM RF switch 700B in FIG. 7B.

As shown in FIG. 7B, segmented lower portions 746 are rectangular segments laid out length-wise over PCM 710. In one implementation, the width of segmented lower portions 746 can be a minimum process size, and the length of segmented lower portions 746 can be twice a minimum process size or longer. As described above, because segmented lower portions 746 are not continuous, less area is available for capacitive coupling and C is significantly reduced, relative to FIG. 3A. Also as described above, because segmented lower portions 746 and their interface areas with PCM 710 are larger, $R_{SEG}$ and $R_{SEG-INT}$ are reduced relative to FIG. 6A.

Figure 8A:
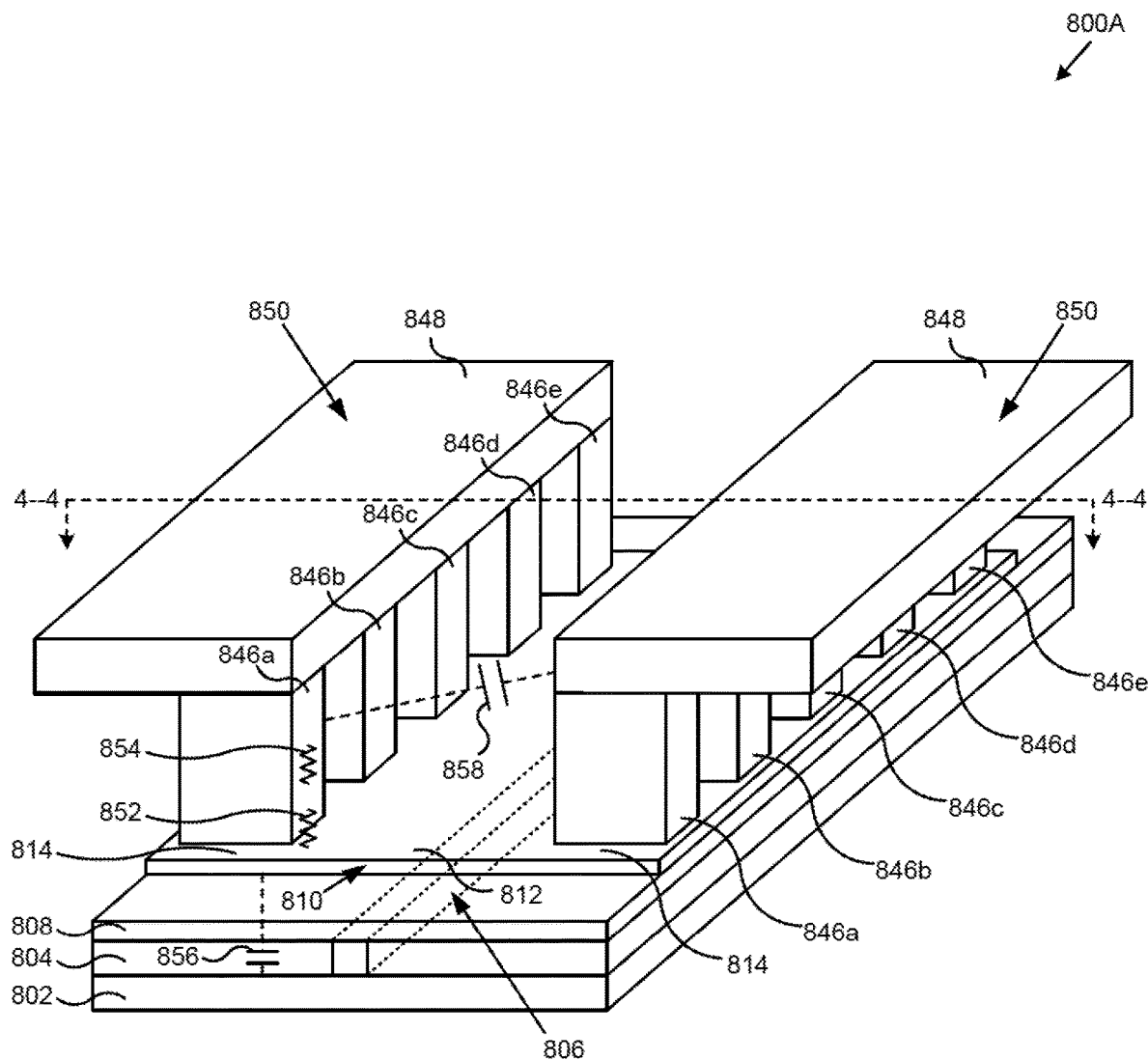
FIG. 8A illustrates a perspective view of a portion of a PCM RF switch according to one implementation of the present application.

FIG. 8A illustrates a perspective view of a portion of a PCM RF switch according to one implementation of the present application. PCM RF switch 400 in FIG. 4 can represent a cross-sectional view along line "4-4" of PCM RF switch 800A in FIG. 8A. As shown in FIG. 8A, PCM RF switch 800A includes substrate 802, lower dielectric 804, heating element 806, thermally conductive and electrically insulating layer 808, PCM 810 having active segment 812 and passive segments 814, PCM contacts 850 having segmented lower portions 846a, 846b, 846c, 846d, and 846e (collectively referred to as segmented lower portions 846) and upper portions 848, resistors 852 and 854, and parasitic capacitors 856 and 858. Heating element 806 is illustrated with dashed lines as seen through various structures of PCM RF switch 800A.

Substrate 802, lower dielectric 804, heating element 806, thermally conductive and electrically insulating layer 808, PCM 810, resistors 852 and 854, and parasitic capacitors 856 and 858 in PCM RF switch 800A in FIG. 8A are similar to corresponding structures in PCM RF switch 700A in FIG. 7A, and may have any implementations and advantages described above. PCM RF switch 800A may include other structures not shown in FIG. 8A, such as a contact uniformity support layer or a contact dielectric.

PCM RF switch 800A includes PCM contacts 850 having segmented lower portions 846. In FIG. 8A, segmented lower portions 846 are rectangular segments. Segmented lower portions 846 are laid out width-wise over PCM 810 (i.e., transverse to heating element 806). As described above, where the width of the active segment of the PCM RF switch is given as a design criteria, wider lower portions 846 result in wider PCM 810 in FIG. 8A, relative to PCM 610 in FIG. 6A.

Resistor 852 represents the resistance between one of segmented lower portions 846a and one of passive segments 814 of PCM 810. In the present implementation, resistor 852 is combined in parallel with other similar resistors of other segments to result in a total segmented interface resistance ($R_{SEG-INT}$) of segmented lower portions 846. The total segmented interface resistance ($R_{SEG-INT}$) in the example of FIG. 8A is about one-tenth of resistance of individual resistor 852. Another resistor (not shown in FIG. 8A) corresponding to the other one of segmented lower portions 846a, along with other resistors (not shown in FIG. 8A) corresponding to segmented lower portions 846b, 846c, 846d, and 846e would represent the remaining resistors that combine in parallel to result in the total segmented interface resistance ($R_{SEG-INT}$).

Resistor 854 represents the resistance of one of segmented lower portions 846a. In the present implementation, resistor 854 is combined in parallel with other similar resistors of other segments to result in a total segmented resistance ($R_{SEG}$) of segmented lower portions 846. The total segmented resistance ($R_{SEG}$) in the example of FIG. 8A is about one-tenth of resistance of individual resistor 854. Another resistor (not shown in FIG. 8A) corresponding to the other one of segmented lower portions 846a, along with other resistors (not shown in FIG. 8A) corresponding to segmented lower portions 846b, 846c, 846d, and 846e, would represent the remaining resistors that combine in parallel to result in the total segmented resistance ($R_{SEG}$).

Parasitic capacitor 856 represents half of the total capacitance ($C_{PCM}$) of PCM 810 to substrate 802. Another parasitic capacitor 856 (not shown in FIG. 8A) would represents the other half of the total capacitance ($C_{PCM}$) of PCM 810 to substrate 802. The two parasitic capacitors 856 (only one of which is shown in FIG. 8A) together would represent the total capacitance ($C_{PCM}$) of PCM 810 to substrate 802. Parasitic capacitor 858 represents the capacitance of one of upper portions 848 to an opposite one of segmented lower portions 846a. In the present implementation, parasitic capacitor 858 represents one tenth of the total capacitance ($C_{UPPER}$) of upper portions 848 to segmented lower portions 846. Another parasitic capacitor (not shown in FIG. 8A) corresponding to the other one segmented lower portions 846a, along with other parasitic capacitors (not shown in FIG. 8A) corresponding to segmented lower portions 846b, 846c, 846d, and 846e, would represent the remainder of the total capacitance ($C_{UPPER}$) of upper portions 848.

Because segmented lower portions 846 in FIG. 8A are not continuous, less area is available to couple with opposite upper portions 848, relative to uniform plate slot lower portions 546 in FIG. 5A. As a result, segmented lower portions 846 in FIG. 8A significantly reduce $C_{UPPER}$ (i.e., reduce parasitic capacitors 458 in FIG. 4), relative to uniform plate slot lower portions 546 in FIG. 5A. Additionally, because segmented lower portions 846 in FIG. 8A are rectangular segments that are laid out width-wise over PCM 810, segmented lower portions 846 are larger, and the interface area of segmented lower portions 846 and PCM 810 is larger, relative to segmented lower portions 646 in FIG. 6A. As a result, segmented lower portions 846 in FIG. 8A reduce $R_{SEG}$ and $R_{SEG-INT}$ (i.e., reduce resistors 254 and 252 in FIG. 2), relative to segmented lower portions 646 in FIG. 6A. Improving $R_{SEG}$, $R_{SEG-INT}$, and $C_{UPPER}$ as shown in FIG. 8A can optimize a product of $R_{ON}$ and $C_{OFF}$ figure of merit for PCM RF switch 800A, especially where more weight is given to $R_{ON}$, relative to PCM RF switch 600A in FIG. 6A.

Figure 8B:
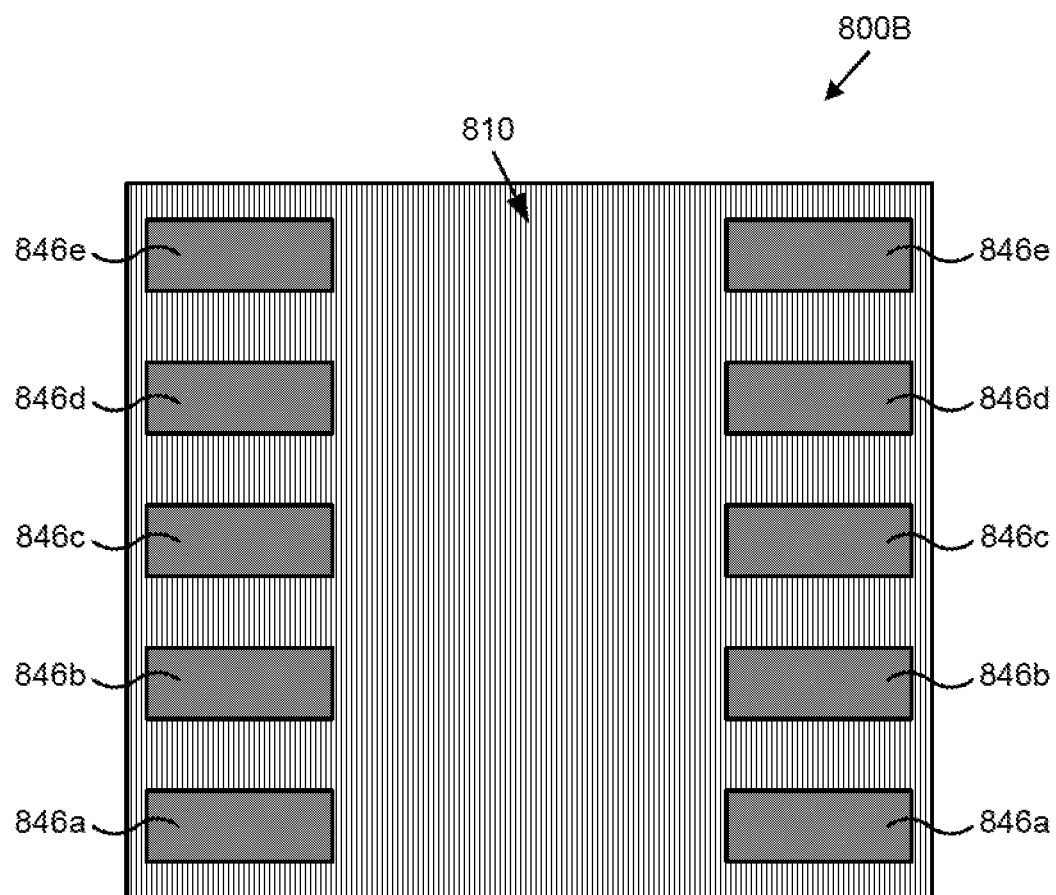
FIG. 8B illustrates a top view of a portion of a PCM RF switch corresponding to the PCM RF switch of FIG. 8A according to one implementation of the present application.

FIG. 8B illustrates a top view of a portion of a PCM RF switch corresponding to the PCM RF switch of FIG. 8A according to one implementation of the present application. Only PCM 810 and segmented lower portions 846a, 846b, 846c, 846d, and 846e (collectively referred to as segmented lower portions 846) are shown in the top view of PCM RF switch 800B in FIG. 8B.

As shown in FIG. 8B, segmented lower portions 846 are rectangular segments laid out width-wise over PCM 810. In one implementation, the length of segmented lower portions 846 can be a minimum process size, and the width of segmented lower portions 846 can be twice a minimum process size or wider. As described above, because segmented lower portions 846 are not continuous, less area is available for capacitive coupling and $C_{UPPER}$ is significantly reduced, relative to FIG. 5A. Also as described above, because segmented lower portions 846 and their interface areas with PCM 810 are larger, $R_{SEG}$ and $R_{SEG-INT}$ are reduced relative to FIG. 6A.

It is noted that although segmented lower portions 846 in FIG. 8A significantly reduce $C_{UPPER}$ (i.e., reduce parasitic capacitors 458 in FIG. 4), relative to uniform plate slot lower portions 546 in FIG. 5A, the reduction in $C_{UPPER}$ in the configuration of FIG. 6A (i.e. using square segments) is more significant than the reduction of $C_{upper}$ in FIG. 8A (i.e. width-wise rectangular segments) since the total surface area of segmented lower portions 846 in FIG. 8A for capacitive coupling with upper portions 848 is greater than the total surface area of segmented lower portions 646 in FIG. 6A for capacitive coupling with upper portions 648.

It is further noted that the width of PCM 810 in the implementation of FIGS. 8A/8B (i.e. width-wise rectangular segments) is analogous to width $W_5$ of PCM 510 in the implementation of FIGS. 5A/5B, while the width of PCM 710 in the implementation of FIGS. 7A/7B (i.e. length-wise rectangular segments) is analogous to width $W_3$ of PCM 310 in the implementation of FIGS. 3A/3B. In other words, the width of PCM 810 in the implementation of FIGS. 8A/8B is greater than the width of PCM 710 in the implementation of FIGS. 7A/7B. As a result, parasitic capacitors 856 (i.e. total capacitance ($C_{PCM}$) of PCM 810 to substrate 802) in the implementation of FIGS. 8A/8B are greater than parasitic capacitors 756 (i.e. total capacitance ($C_{PCM}$) of PCM 710 to substrate 702) in the implementation of FIGS. 7A/7B.

Thus, in various implementations of the present application, PCM RF switches with advantageous PCM contact configurations overcome the deficiencies in the art. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A radio frequency (RF) switch comprising:
 a phase-change material (PCM) and a heating element approximately underlying an active segment of said PCM, said PCM and said heating element being situated over a substrate;
 a contact dielectric over said PCM;
 PCM contacts comprising upper portions and width-wise segmented lower portions;
 said width-wise segmented lower portions having a total segmented resistance $R_{SEG}$, and a total segmented interface resistance $R_{SEG-INT}$;
 said upper portions having a total capacitance $C_{UPPER}$ to said width-wise segmented lower portions;
 said width-wise segmented lower portions resulting in significantly reducing said $C_{UPPER}$, said $R_{SEG}$, and said $R_{SEG-INT}$.

2. The RF switch of claim 1, further comprising a thermally conductive and electrically insulating layer under said PCM.

3. The RF switch of claim 2, wherein said thermally conductive and electrically insulating layer comprises a material selected from the group consisting of aluminum nitride (AlN), aluminum oxide ($Al_XO_Y$), beryllium oxide ($Be_XO_Y$), silicon carbide (SiC), diamond, and diamond-like carbon.

4. The RF switch of claim 2, wherein a thickness of said contact dielectric is significantly greater than a thickness of said thermally conductive and electrically insulating layer.

5. The RF switch of claim 1, wherein said PCM comprises a material selected from the group consisting of germanium telluride ($Ge_XTe_Y$), germanium antimony telluride ($Ge_XSb_YTe_Z$), germanium selenide ($Ge_XSe_Y$), and any other chalcogenide.

6. The RF switch of claim 1, wherein a contact uniformity support layer is situated over said PCM, wherein said contact uniformity support layer comprises nitride.

7. The RF switch of claim 1, wherein a contact uniformity support layer is situated over said PCM, wherein said contact uniformity support layer comprises a bi-layer that includes oxide and nitride.

8. The RF switch of claim 1, wherein a contact uniformity support layer is situated over said PCM, wherein said contact uniformity support layer significantly reduces said total segmented interface resistance $R_{SEG-INT}$.

9. The RF switch of claim 1, wherein said contact dielectric comprises a material selected from the group consisting of $SiO_2$, boron-doped $SiO_2$, phosphorous-doped $SiO_2$, $Si_XN_Y$, fluorinated silicon dioxide, carbon-doped silicon oxide, and spin-on organic polymer.

10. The RF switch of claim 1, wherein said upper portions of said PCM contacts comprise a material selected from the group consisting of tungsten, aluminum, and copper.

11. The RF switch of claim 1, wherein said width-wise segmented lower portions of said PCM contacts comprise a material selected from the group consisting of tungsten, aluminum, and copper.

12. A radio frequency (RF) switch comprising:
a phase-change material (PCM) and a heating element, said PCM and said heating element being situated over a substrate;
PCM contacts comprising upper portions and width-wise segmented lower portions;
said upper portions having a total capacitance $C_{UPPER}$ to said width-wise segmented lower portions, said width-wise segmented lower portions having a total segmented resistance $R_{SEG}$, and a total segmented interface resistance $R_{SEG-INT}$, wherein said width-wise segmented lower portions result in significantly reducing said $C_{UPPER}$, said $R_{SEG}$, and said $R_{SEG-INT}$.

13. The RF switch of claim 12, further comprising a thermally conductive and electrically insulating layer under said PCM.

14. The RF switch of claim 13, wherein said thermally conductive and electrically insulating layer comprises a material selected from the group consisting of aluminum nitride (AlN), aluminum oxide ($Al_XO_Y$), beryllium oxide ($Be_XO_Y$), silicon carbide (SiC), diamond, and diamond-like carbon.

15. The RF switch of claim 12, wherein said PCM comprises material selected from the group consisting of germanium telluride ($Ge_XTe_Y$), germanium antimony telluride ($Ge_XSb_YTe_Z$), germanium selenide ($Ge_XSe_Y$), and any other chalcogenide.

16. The RF switch of claim 12, wherein a contact uniformity support layer is situated over said PCM, wherein said contact uniformity support layer comprises nitride.

17. The RF switch of claim 12, wherein a contact uniformity support layer is situated over said PCM, wherein said contact uniformity support layer comprises a bi-layer that includes oxide and nitride.

18. The RF switch of claim 12, wherein a contact uniformity support layer is situated over said PCM, wherein said contact uniformity support layer significantly reduces said total segmented interface resistance $R_{SEG-INT}$.

19. The RF switch of claim 12, wherein said upper portions of said PCM contacts comprise a material selected from the group consisting of tungsten, aluminum, and copper.

20. The RF switch of claim 12, wherein said width-wise segmented lower portions of said PCM contacts comprise a material selected from the group consisting of tungsten, aluminum, and copper.

* * * * *